(12) United States Patent
Abdul Rahman et al.

(10) Patent No.: US 9,748,126 B2
(45) Date of Patent: Aug. 29, 2017

(54) MAGAZINE FOR PACKAGED INTEGRATED CIRCUITS

(71) Applicant: Texas Instruments Incorporated, Dallas, TX (US)

(72) Inventors: Razleen Abdul Rahman, Kuala Lumpur (MY); Sahaimi Mohamad Yazid, Selangor (MY); Mohd Zairi Haron, Selangor (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/985,577

(22) Filed: Dec. 31, 2015

(65) Prior Publication Data

US 2017/0194179 A1    Jul. 6, 2017

(51) Int. Cl.
*H01L 21/673* (2006.01)

(52) U.S. Cl.
CPC .. *H01L 21/67373* (2013.01); *H01L 21/67356* (2013.01)

(58) Field of Classification Search
CPC ........ B65D 73/02; B65D 85/00; B65D 85/30; B65D 85/42; B65D 85/48; H01L 21/673; H01L 21/67356; H01L 21/67373; H05K 13/0084
USPC ................. 206/557–565, 701, 718, 722, 724
See application file for complete search history.

(56) References Cited

U.S. PATENT DOCUMENTS

| 4,533,043 | A | * | 8/1985 | Swain | H05K 13/0084 206/718 |
| 4,598,820 | A | * | 7/1986 | Murphy | H05K 13/0084 206/718 |
| 4,899,876 | A | * | 2/1990 | Murphy | H05K 13/0084 206/718 |
| 4,901,853 | A | * | 2/1990 | Maryatt | H01L 21/67356 206/722 |
| 5,476,174 | A | * | 12/1995 | Uratsuji | H05K 13/0084 206/722 |

\* cited by examiner

*Primary Examiner* — Bryon Gehman
(74) *Attorney, Agent, or Firm* — Charles A. Brill; Frank D. Cimino

(57) ABSTRACT

An IC magazine with retractable stop pins at both ends of the IC magazine. An IC magazine with retractable stop pins on both ends of the IC magazine. The retractable stop pins project into the magazine slot through an opening from a cavity in the base of the IC magazine. The long segment of an L-shaped push rod projects through an opening from the cavity through the magazine rail. The short segment of the L-shaped push rod is coupled to the bottom of the retractable stop pin inside the cavity. A spring inside the cavity between the underside of the short segment and the bottom of the cavity holds the retractable stop pin in an up position. An IC magazine with retractable stop pins at both ends of the IC magazine. The retractable stop pins project into the magazine slot through an opening from a cavity in the base of the IC magazine. A stop collar surrounding the retractable stop pin inside the cavity. A spring inside the cavity that pushes up on the underside of the stop collar and pushes down on the bottom of the cavity.

13 Claims, 6 Drawing Sheets

MAGAZINE FOR PACKAGED INTEGRATED CIRCUITS

FIELD

This disclosure relates to the field of integrated circuits. More particularly, this disclosure relates to an improved magazine holder for packaged integrated circuits.

BACKGROUND

Integrated circuit (IC) magazines such as are illustrated in FIGS. 1A, 1B, and 1C are used to store and transport packaged ICs during testing and packaging.

FIG. 1A is a top down view of a conventional integrated circuit magazine 100. The integrated circuit magazine 100 is a tray with magazine slots 108 that accommodate packaged ICs 114. The magazine slots 108 lie between magazine rails 108.

FIG. 1B shows the open end of a conventional IC magazine 100. Packaged IC's 114 may be inserted into the magazine slots 108 at the open end of the IC magazine 100.

A cross sectional view of the open end of the conventional IC magazine 100 is depicted in FIG. 2. The cross section shows magazine slots 108 between magazine rails 110. A packaged IC 114 is shown in one of the magazine slots 108.

FIG. 1C shows the closed end of a conventional IC magazine 100. A stop pin 112 formed in the middle of the magazine slot 108 at the closed end to keep the packaged ICs 114 from falling out of the IC magazine is typical.

A cross sectional view of the closed end of the conventional IC magazine 100 is depicted in FIG. 3. The cross section shows magazine slots 108 between magazine rails 110. The stop pin 112 in the middle of the magazine slot 108 prevents packaged ICs from falling out of the closed end. A packaged IC 114 which is blocked by the stop pin 112 is shown in one of the magazine slots 108.

IC chips typically are loaded into conventional IC magazines after they have been molded into a dual inline package (DIP). The DIPs may then be transported in the IC magazine to testing equipment to verify functionality. The testing equipment typically unloads the DIPs from the IC magazine, plugs them into an IC socket, and tests them. After testing the DIPs are typically loaded back into the IC magazine and transported to another machine which packages the DIPs for use in automated pick and place circuit board manufacturing equipment. For example, the IC magazine may be inserted into a tape and reel packaging machine which attaches the packaged ICs to reels of tape which are used in automated circuit board manufacturing equipment.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An IC magazine with retractable stop pins at both ends of the IC magazine. An IC magazine with retractable stop pins on both ends of the IC magazine. The retractable stop pins project into the magazine slot through an opening from a cavity in the base of the IC magazine. The long segment of an L-shaped push rod projects through an opening from the cavity through the magazine rail. The short segment of the L-shaped push rod is coupled to the bottom of the retractable stop pin inside the cavity. A spring inside the cavity between the underside of the short segment and the bottom of the cavity holds the retractable stop pin in an up position. An IC magazine with retractable stop pins at both ends of the IC magazine. The retractable stop pins project into the magazine slot through an opening from a cavity in the base of the IC magazine. A stop collar surrounding the retractable stop pin inside the cavity. A spring inside the cavity that pushes up on the underside of the stop collar and pushes down on the bottom of the cavity.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1A:
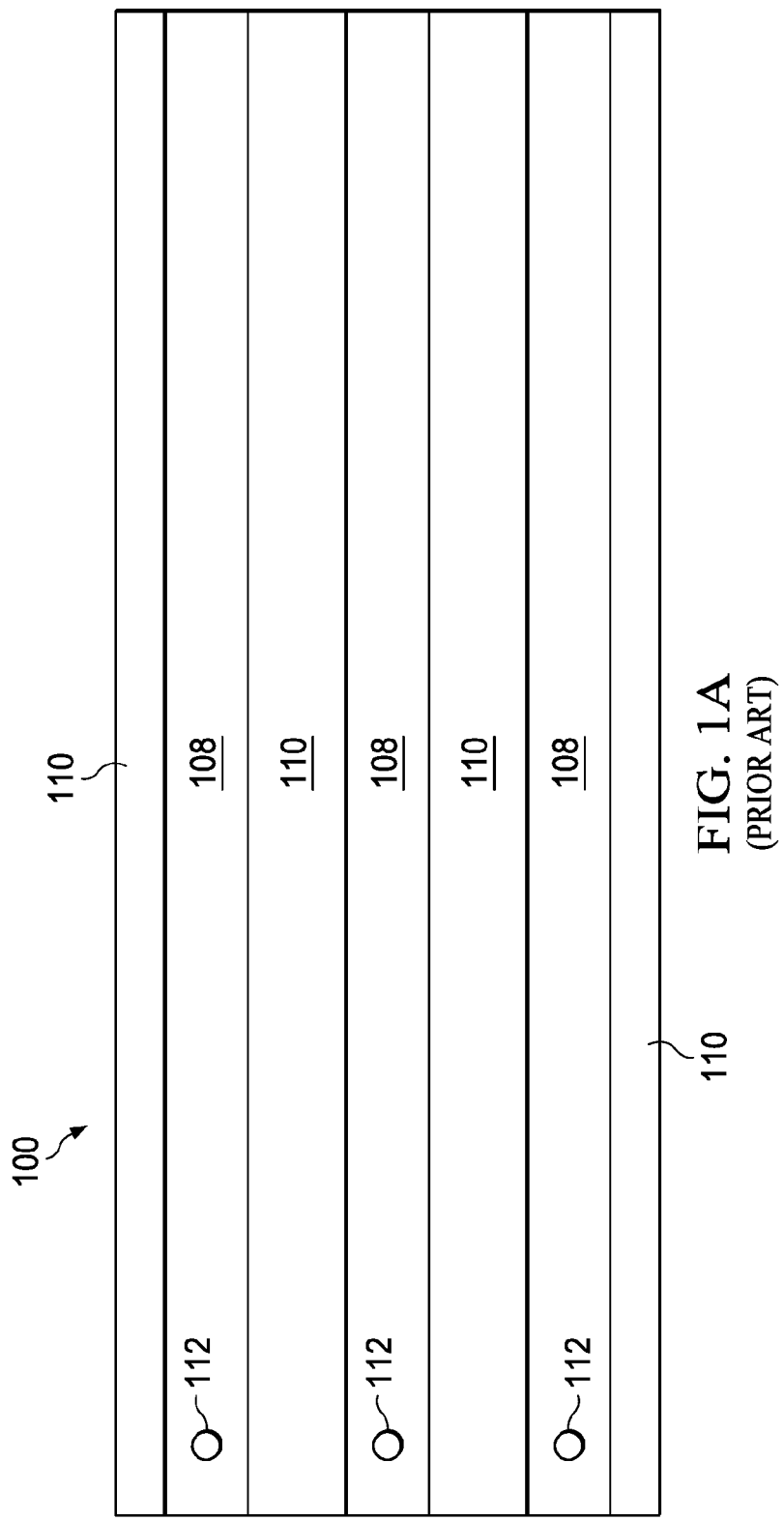
FIGS. 1A, 1B, and 1C (Prior art) are a plan view of an IC magazine.
Figure 1B:
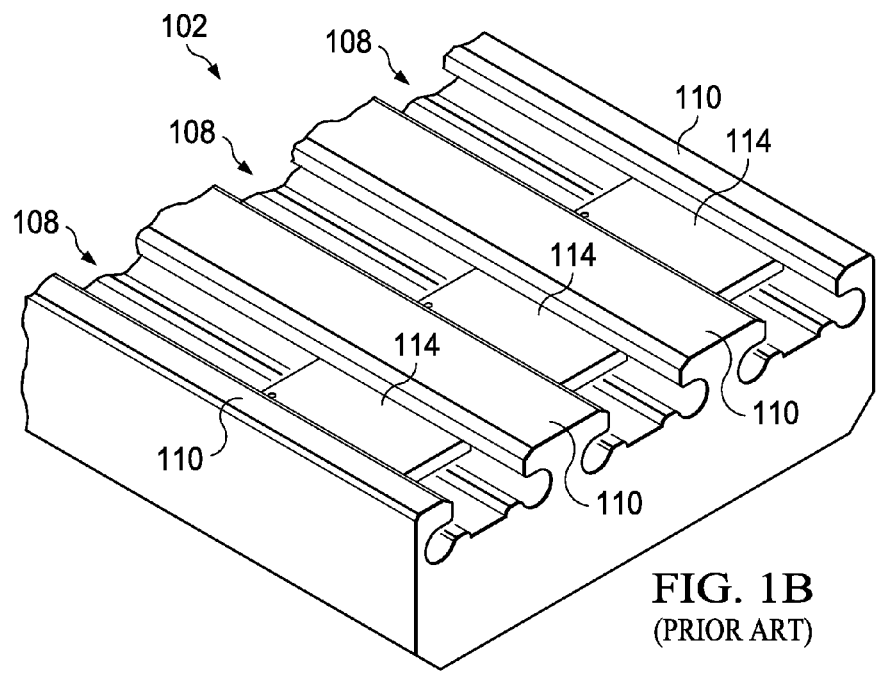
Figure 1C:
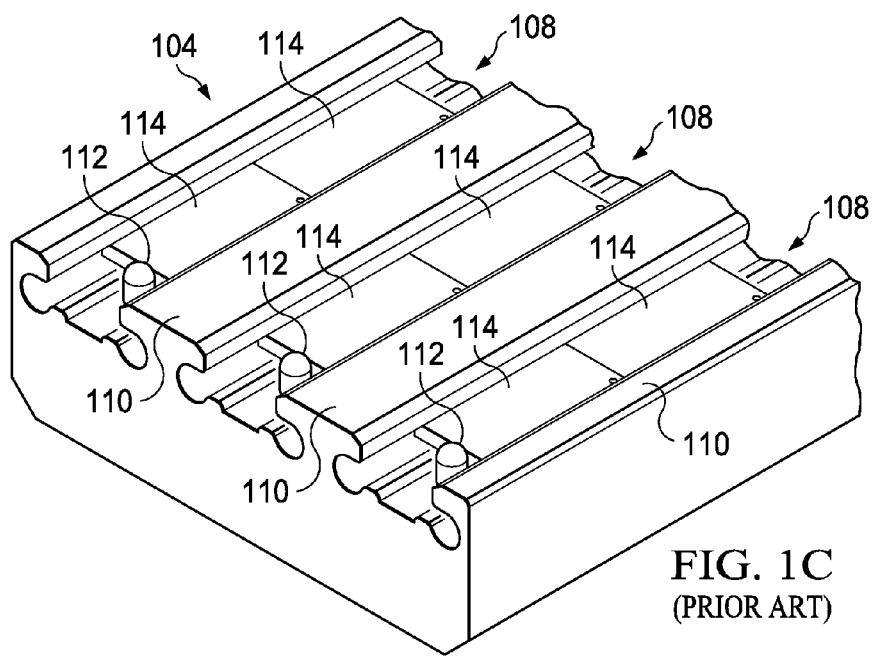
Figure 2:
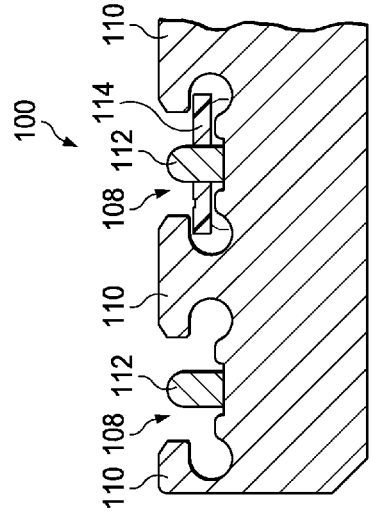
FIG. 2 (Prior art) is a cross sectional view of the open end of an IC magazine.
Figure 3:
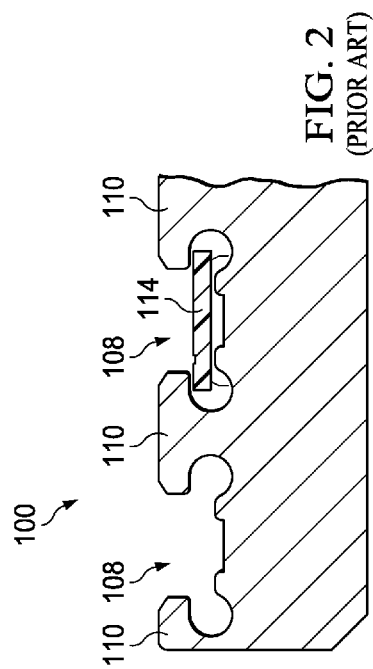
FIG. 3 (Prior art) is a cross sectional view of the end of an IC magazine with a stop pin.
Figure 4:
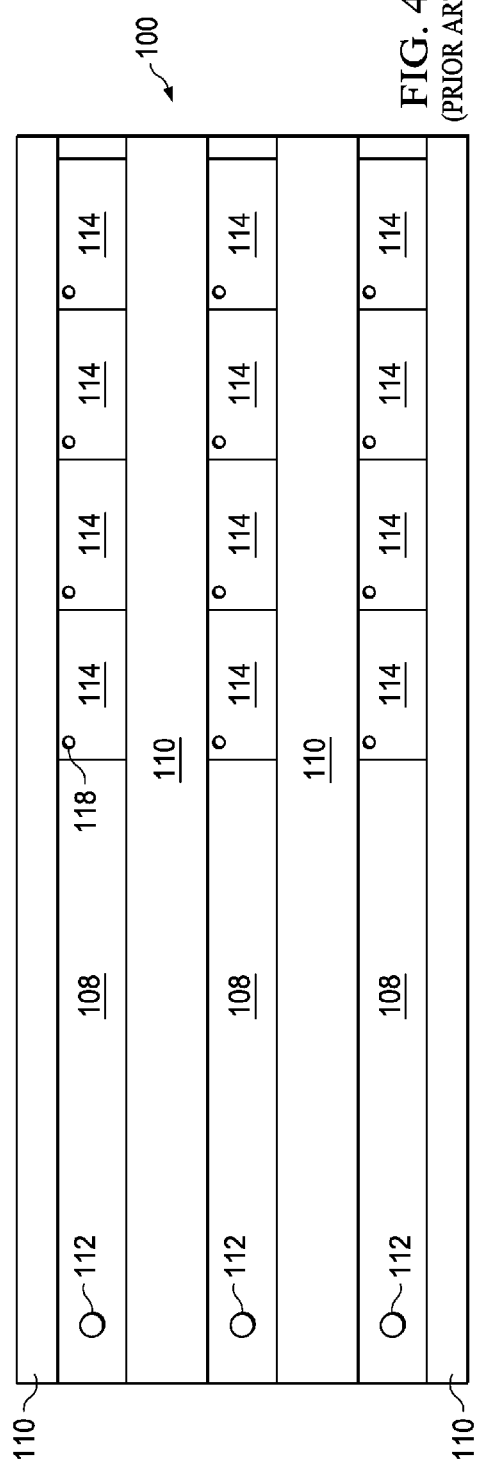
FIGS. 4 & 5 (Prior art) are plan views of packaged integrated circuits in an IC magazine.
Figure 5:
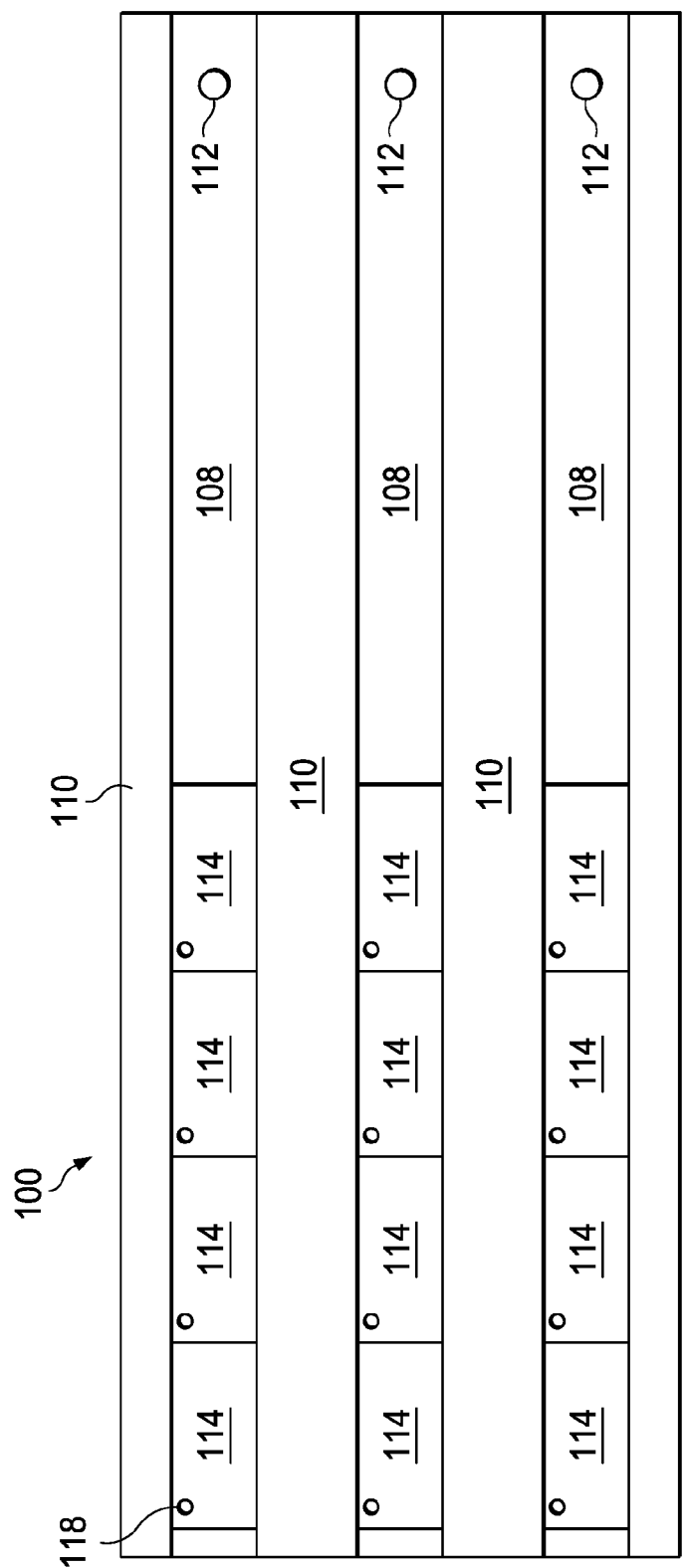

One problem that arises when using conventional IC magazines is illustrated in FIGS. 4 and 5. The dot 118 on top of the DIP 114 indicates the position of pin 1. As is illustrated in FIGS. 4 and 5 the DIP 114 may have two orientations in the IC magazine 100. In FIG. 4 the end of the DIP 114 with pin 1 is closest to the stop pin 112 whereas in FIG. 5 the end of the DIP with pin 1 is farthest away from the stop pin 112.

Frequently the DIPs 114 are not in the orientation required by the electronic testing equipment or the tape and reel machine or some other DIP packaging machine. When this occurs typically an empty IC magazine is manually placed end-to-end with the full IC magazine and the DIPs 114 are transferred from the full IC magazine to the empty one using gravity. This transfer adds time to the operation and typically results in a several percent yield loss due to DIPs being damaged during the extra handling.

Figure 6:
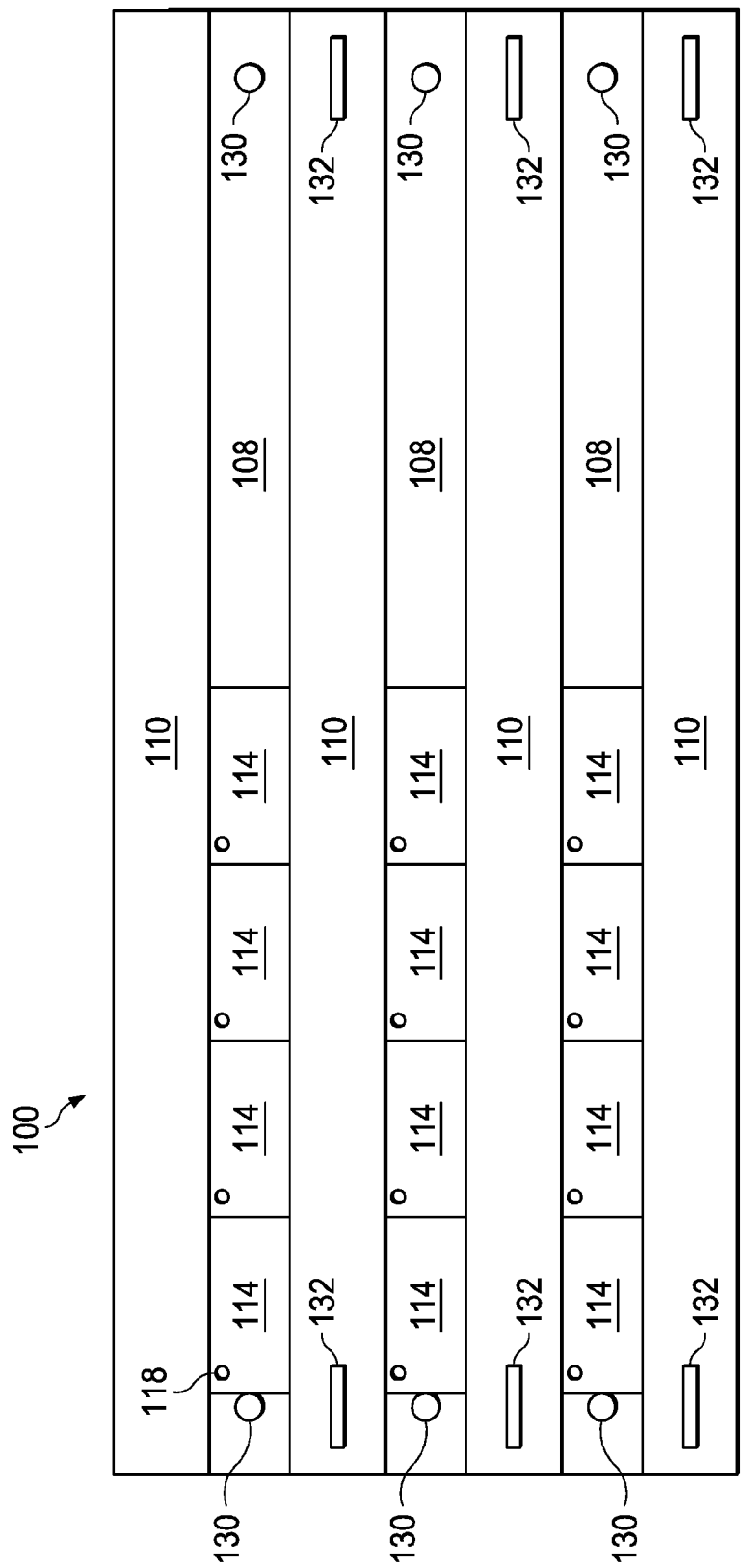
FIG. 6 is a plan view of an IC magazine with retractable stop pins formed according to an embodiment.

An IC magazine with embodiment retractable stop pins 130 at both ends of the IC magazine 100 is illustrated in FIGS. 6 and 7.

Figure 7A:
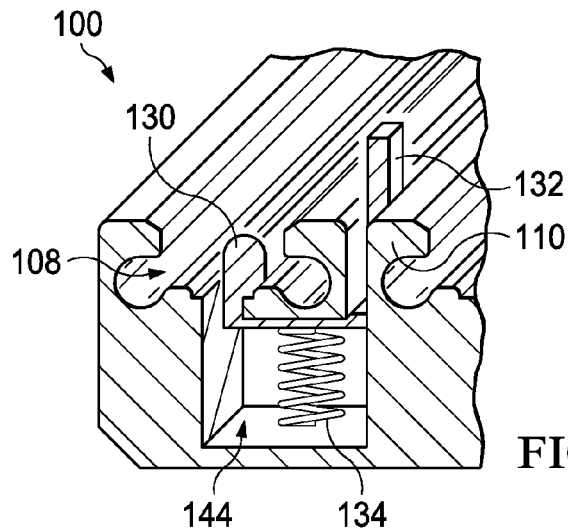
FIGS. 7A and 7B are cross sections of retractable stop pins formed according to embodiments.

FIG. 7A is a cross section of an embodiment retractable stop pin 130. In this embodiment a rectangular cavity 144 with one opening through the bottom of the magazine slot 108 and a second opening through the magazine rail 110 is formed in the base of the IC magazine 100. The embodiment retractable stop pin 130 protrudes through the opening from the cavity 144 through the magazine slot 108. Inside the cavity 144 the short segment of an L-shaped push rod 132 is connected to the bottom of the retractable stop pin 130. The long segment of the L-shaped push rod 132 protrudes through the opening from the cavity 144 through the magazine rail 110.

Figure 7B:
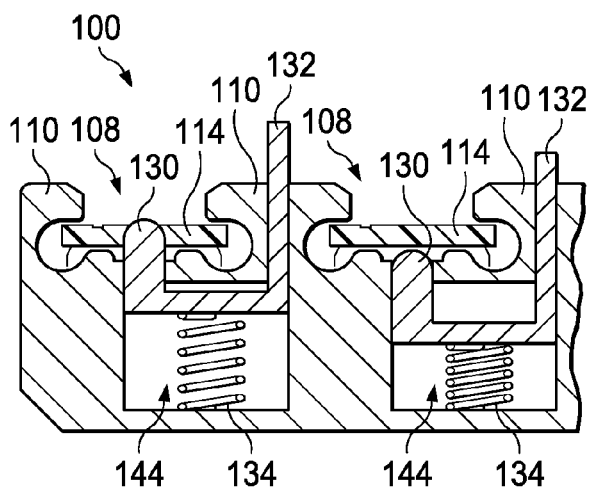

As shown in FIGS. 7A and 7B (left side) a spring 134 between the underside of the short segment of the L-shaped push rod 132 and the bottom of the cavity 144 applies upward pressure to the L-shaped push rod 132/retractable stop pin 130 assembly to keep the retractable stop pin 130 in an up position when required to keep the DIPs 114 in the IC magazine 100.

As shown in FIG. 7B (right side) downward pressure may be applied to the top of the long segment of L-shaped push rod 132 to depress the spring 134 and force the retractable stop pin 130 into a down position. With the retractable stop pin 130 in a down position, the DIPs 114 may be readily removed from the IC magazine 100.

As is illustrated in FIG. 6, embodiment retractable stop pins 130 may be built into both ends of the IC magazine 100, making the IC magazine 100 symmetrical. This enables DIPs 114 to be loaded into and loaded out of the IC magazine 100 from either end. With the embodiment stop pins 130 on both ends of the IC magazine, transfer of DIPs from one IC magazine to another to properly orient pin 1 is no longer needed. In addition to reducing scrap, this embodiment also reduces cycle time by eliminating the IC magazine-to-IC magazine transfer step.

Figure 8:
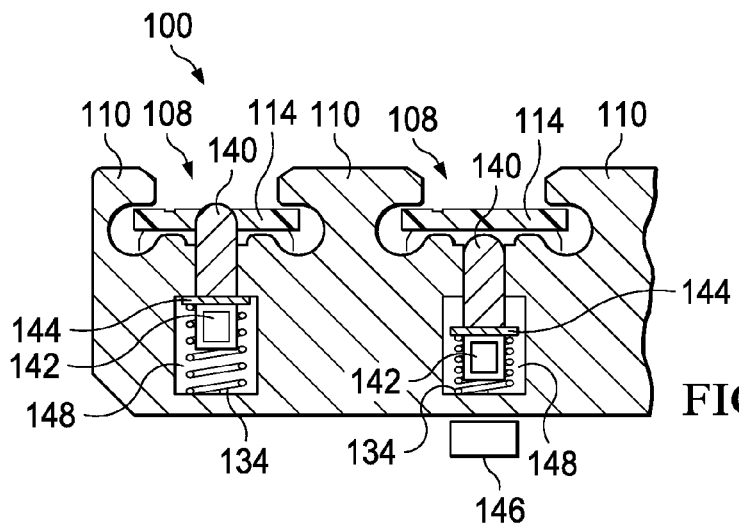
FIG. 8 is a cross section of retractable stop pins formed according to an embodiment.

One method of forming retractable stop pins at both ends of the IC magazine is illustrated in FIGS. 7A and 7B. Other retractable stop pin designs are possible. For example, as is illustrated in FIG. 8 (left side), a retractable stop pin 140 with a magnet 142 in the bottom may be formed. A cavity 148 is formed in the base of the IC magazine 100 under the magazine slot 108 with an opening from the cavity 148 through the magazine slot 108. The retractable stop pin 140 with a stop collar 144 which surrounds the retractable stop pin 140 projects from the cavity 148 through the opening. In the up position the stop collar 144 contacts the top of the cavity 148. The retractable stop pin 140 may be held in the up position by a spring 134 which surrounds the bottom of the retractable stop pin 140 below the stop collar 144. The spring 134 pushes up against the stop collar 144 and down against the bottom of the cavity 148 to hold the retractable stop pin 140 in place.

As shown in FIG. 8 (right side) an electromagnet 146 may be turned on below the retractable stop pin 140 to cause spring 134 to compress and retract into a down position so the DIPs 114 may be removed from the IC magazine 100.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. An integrated circuit (IC) magazine, comprising:
   a first retractable stop pin at a first end of the IC magazine;
   a second retractable stop pin at a second end of the IC magazine;
   a magazine slot and a magazine rail in the IC magazine;
   a cavity in the IC magazine at the first end and aligned with the magazine slot and the magazine rail;
   a first opening from the cavity through the magazine slot with the first retractable stop pin projecting from the cavity through the first opening;
   a second opening from the cavity through the magazine rail with a long segment of a push rod projecting from the cavity through the second opening;
   a short segment of the push rod coupled to the first retractable stop pin inside the cavity; and
   a spring between a side of the cavity and the short segment.

2. The IC magazine of claim 1, further comprising:
   a stop collar surrounding a portion of the first retractable stop pin inside the cavity and in contact with the spring.

3. The IC magazine of claim 2, wherein the first retractable stop pin and the second retractable stop pin include a magnetic material.

4. The IC magazine of claim 2, wherein the first retractable stop pin and the second retractable stop pin includes a magnet inside a side of the each of the first retractable stop pin and the second retractable stop pin.

5. The IC magazine of claim 1, wherein the push rod includes an L-shape with the long segment and the short segment.

6. An integrated circuit (IC) magazine, comprising:
   a magazine slot and a magazine rail in the IC magazine;
   a first cavity in the IC magazine at a first end of the IC magazine;
   a first opening from the first cavity and where a portion of the first retractable stop pin projects from the first cavity through the first opening;
   a second opening from the first cavity through the magazine rail and where a portion of a first long segment of a first L-shaped push rod projects from the first cavity through the second opening;
   a first short segment of the first L-shaped push rod is coupled to the first retractable stop pin inside the first cavity;
   a first spring between the first cavity and the first short segment;
   a second cavity in the IC magazine at a second end of the IC magazine;
   a third opening from the second cavity of the magazine slot and where a portion of a second retractable stop pin projects from the second cavity through the third opening;
   a fourth opening from the second cavity through the magazine rail and where a portion of a second long segment of a second L-shaped push rod projects from the second cavity through the fourth opening;
   a second short segment of the second L-shaped push rod coupled to the second retractable stop pin inside the second cavity; and
   a second spring between the second cavity and the second short segment.

7. An integrated circuit (IC) magazine, comprising:
a magazine slot and a magazine rail in the IC magazine;
a first cavity in the IC magazine at a first end of the IC magazine;
a first opening from the first cavity and where a portion of the first retractable stop pin projects from the first cavity through the first opening;
a first stop collar surrounding the first retractable stop pin inside the first cavity;
a first spring surrounding a portion of the first retractable stop pin and contacting the first stop collar and the first cavity;
a second cavity in the IC magazine at a second end of the IC magazine and aligned with the magazine slot;
a second opening from the second cavity through the magazine slot and where a portion of a second retractable stop pin projects from the second cavity through the second opening;
a second stop collar surrounding the second retractable stop pin inside the second cavity;
a second spring surrounding a portion of the second retractable stop pin and contacting the second stop collar and the second cavity.

8. The IC magazine of claim 7, wherein the first and the second retractable stop pins include a magnetic material.

9. The IC magazine of claim 7, wherein the first and the second retractable stop pins include a first magnet inside the first retractable stop pin and a second magnet inside the second retractable stop pin.

10. The IC magazine of claim 9, wherein the first magnet and the second magnet are inside bottom portions of the first retractable stop pin and second retractable stop pin respectively.

11. The IC magazine of claim 7, wherein the first cavity and the second cavity are connected to the magazine slot by the first opening and the second opening respectively.

12. The IC magazine of claim 6, wherein the first cavity and the second cavity are in a base of the IC magazine aligned with the magazine slot and the magazine rail.

13. The IC magazine of claim 6, wherein the first opening connects the cavity and the magazine slot.

* * * * *